United States Patent
Yamashita

(10) Patent No.: US 8,164,355 B2
(45) Date of Patent: Apr. 24, 2012

(54) ELECTRONIC COMPONENT PRESSING DEVICE AND ELECTRONIC COMPONENT TEST APPARATUS

(75) Inventor: Tsuyoshi Yamashita, Tokyo (JP)

(73) Assignee: Advantest Corporation, Tokyo (JP)

( * ) Notice: Subject to any disclaimer, the term of this patent is extended or adjusted under 35 U.S.C. 154(b) by 362 days.

(21) Appl. No.: 12/527,976

(22) PCT Filed: Jan. 18, 2008

(86) PCT No.: PCT/JP2008/050579
§ 371 (c)(1),
(2), (4) Date: Aug. 20, 2009

(87) PCT Pub. No.: WO2008/102581
PCT Pub. Date: Aug. 28, 2008

(65) Prior Publication Data
US 2010/0019791 A1 Jan. 28, 2010

(30) Foreign Application Priority Data
Feb. 23, 2007 (JP) ................................ 2007-043334

(51) Int. Cl.
*G01R 31/20* (2006.01)
(52) U.S. Cl. ......... 324/757.01; 324/750.25; 324/754.11; 324/756.02; 324/757.04; 324/762.02
(58) Field of Classification Search ........... 324/754.08–754.16, 756.01–756.02, 324/762.01–762.03, 750.16–750.25, 754.1–754.14, 324/757.01–757.05
See application file for complete search history.

(56) References Cited

U.S. PATENT DOCUMENTS

| 6,741,090 B2 * | 5/2004 | Yamashita ............... 324/750.08 |
| 7,202,693 B1 * | 4/2007 | Kush ........................ 324/750.11 |
| 2009/0102497 A1 | 4/2009 | Ito et al. |

FOREIGN PATENT DOCUMENTS

| JP | 7-239362 A | 9/1995 |
| JP | 2004-527764 A | 9/2004 |
| TW | I228599 B | 3/2005 |
| WO | 03/075023 A1 | 9/2003 |
| WO | 2004/051292 A1 | 6/2004 |
| WO | 2007/010610 A1 | 1/2007 |

OTHER PUBLICATIONS

Notification of Transmittal of Translation of the International Preliminary Report on Patentability from PCT/JP2008/050579, dated Sep. 11, 2009 (6 pages).
International Search Report issued in PCT/JP2008/050579, mailed on Apr. 22, 2008, with translation, 4 pages.
Written Opinion issued in PCT/JP2008/050579, mailed on Apr. 22, 2008, 3 pages.
Taiwanese Office Action issued in Taiwan Patent Application No. 097102776 mailed on Jul. 22, 2011, (1 page).

* cited by examiner

*Primary Examiner* — Arleen M Vazquez
(74) *Attorney, Agent, or Firm* — Osha • Liang LLP

(57) ABSTRACT

An electronic component pressing device includes a first pressing member for pressing a predetermined first region of the electronic component to be tested; a second pressing member for pressing a predetermined second region other than the first region of the electronic component to be tested; a gimbal mechanism for adhering the first pressing member to the first region when the first pressing member presses the first region of the electronic component to be tested; first pressing load applying means for applying a pressing load on the gimbal mechanism; and second pressing load applying means for applying a pressing load on the second pressing member.

9 Claims, 8 Drawing Sheets (Prior Art)

ELECTRONIC COMPONENT PRESSING DEVICE AND ELECTRONIC COMPONENT TEST APPARATUS

TECHNICAL FIELD

The present invention relates to an electronic component pressing device for pushing a terminal of an electronic component to be tested against a contact portion of a test head in order to test various types of electronic components such as IC devices which are made into integrated circuits, and an electronic component test apparatus including the electronic component pressing device.

BACKGROUND ART

A test of electronic components by using an electronic component test apparatus is performed, for example, as below. After an IC device is conveyed above a test head provided with a socket, the IC device is pressed by using an electronic component pressing device to mount it to the socket, so that connection terminals of the socket are brought to contact with external terminals of the IC device. As a result, the IC device is electrically connected to a tester main body through the socket, the test head and a cable. Then, a test signal supplied from the tester main body to the test head through the cable is supplied to the IC device, and a response signal read from the IC device is sent to the tester main body through the test head and the cable, so that electric characteristics of the IC device are measured.

The above test often is performed by applying thermal stress to an IC device. As an example of methods for applying thermal stress to the IC device, the IC device is heated to a predetermined set temperature before conveyed to the test head. In addition, a heater is provided in a device for conveying IC devices to prevent the temperature of the heated IC device from decreasing during conveying, and the heater heats the IC device.

Moreover, depending on a type of the IC device, for a die (IC chip) portion with an integrated circuit configured, it is necessary to prevent the integrated circuit from being destroyed due to an excessive load at the time of pressing, as well as for a substrate portion of the IC device, to prevent poor contact between the external connecting terminals of the IC device and the connecting terminals of the socket by a certain amount of load. Thus, it is possible that loads at the time of pressing have to be different between the die portion and the other substrate portion of the IC device.

As a conventional electronic component pressing device that meets such requirements, for example, a device described in Patent Document 1 (hereinafter called a conventional device) is known.

As shown in FIG. 8, this conventional device includes a support member 1 attached to a tip portion of a rod (not shown) and driven in a Z-axis direction (upward/downward directions), a joint member 2 provided to a peripheral portion on the lower side of the support member 1, a heat block 3 provided in a center portion on the lower side of the support member 1, a first pusher 5 provided on the lower side of the heat block 3 and for pressing a die portion 81 of an IC device 8, and a second pusher 6 provided on the lower side of the joint member 2 and for pressing a substrate 82 of the IC device 8.

First springs 4 and 4 are provided between the support member 1 and the heat block 3. The first springs 4 and 4 bias the support member 1 and the heat block 3 in the direction of separating from each other.

Second springs 7 and 7 are provided between a convex portion 51 of the first pusher 5 and a convex portion 61 of the second pusher 6. The second springs 7 and 7 bias the first pusher 5 and the second pusher 6 in the direction of separating from each other.

In the conventional device having such configuration, a pressing load on the die 81 of the IC device 8 and a pressing load on the substrate 82 of the IC device 8 can be individually managed by means of the first pusher 5 and the second pusher 6. Specifically, the die 81 of the IC device 8 is pressed by a load that does not damage the integrated circuit, and the substrate 82 of the IC device 8 can prevent the poor contact between external connecting terminals of the IC device 8 and connecting terminals of the socket.

Also, in the conventional device, the first springs 4 and 4 bias the heat block 3 downwardly, as well as the second springs 7 and 7 bias the first pusher 5 upwardly and the second pusher 6 downwardly. Therefore, both a surface conformance between a lower surface of the heat block 3 and an upper surface of the first pusher 5, as well as a surface conformance between a lower surface of the first pusher 5 and an upper surface of the die 81 of the IC device 8 are ensured.

Patent Document 1: International Publication No. WO2004/051292

However, the conventional device has the following disadvantages.

(1) The first pusher 5 presses the die 81 of the IC device 8 and the second pusher 6 presses the substrate 82 of the IC device 8, and hence their pressing loads can be individually managed. However, the pressing load of the first pusher 5 is based on biasing force of the first springs 4 and 4 as well as the second springs 7 and 7, and hence under such constraint, it cannot be arbitrarily adjusted, finely adjusted and the like. Therefore, when the two pressing loads are individually managed, the pressing load of the first pusher 5 cannot be minutely managed as required.

(2) The pressing load of the first pusher 5 cannot be arbitrarily adjusted, finely adjusted and the like. Therefore, in the case of changing the type of an electronic component to be subjected to the test, in response to the change, replacement of the first springs 4 and 4 as well as the second springs 7 and 7 is needed each time.

(3) The first springs 4 and 4 bias the heat block 3 downwardly, as well as the second springs 7 and 7 bias the first pusher 5 upwardly and bias the second pusher 6 downwardly. Therefore, the surface conformance between the lower surface of the first pusher 5 and the upper surface of the die 81 of the IC device 8 can be realized. However, since such surface conformance mechanism uses the first springs 4 and 4 as well as the second springs 7 and 7, such mechanism is insufficient.

(4) In an actual use, it is in the die portion of the IC device that the IC device has a problem of temperature, and hence, preferably, the thermal stress is particularly applied to the die during testing. On the other hand, as IC devices downsized, heat generation during testing also increases. Thus, in order to reduce heat generation during the testing, the IC device is preferably cooled during testing. However, a structure for heating and cooling the die portion of the IC device is not appropriate, and the advent of an appropriate structure is desired.

Accordingly, in view of the above points, an object of the present invention is to provide an electronic component pressing device and an electronic component test apparatus in which a pressing load on a die and a substrate of an electronic component can be individually managed, in such case the pressing load on the die of the electronic component can be minutely managed as required, and adhesion of a pressing member to the die of the electronic component can be enhanced.

DISCLOSURE OF THE INVENTION

An electronic component pressing device of the present invention is an electronic component pressing device for pushing a terminal of an electronic component to be tested against a contact portion of a test head, comprising: a first pressing member for pressing a predetermined first region of the electronic component to be tested; a second pressing member for pressing a predetermined second region other than the first region of the electronic component to be tested; a gimbal mechanism for adhering the first pressing member to the first region when the first pressing member presses the first region of the electronic component to be tested; first pressing load applying means for applying a pressing load on the gimbal mechanism; and second pressing load applying means for applying a pressing load on the second pressing member.

Accordingly, the pressing loads on a die and a substrate of the electronic component can be individually managed, in such case the pressing load on the die of the electronic component can be minutely managed as required, and adhesion of the pressing member to the die of the electronic component can be enhanced.

As an implementation of the present invention, the first pressing member is configured to press a center area of the electronic component to be tested; the second pressing member is configured to press a predetermined part other than the center area of the electronic component to be tested; the first pressing load applying means including a first actuator; and the second pressing load applying means including a second actuator.

Accordingly, a large pressing load can be applied on the substrate of the electronic component, while for the pressing load on the die of the electronic component, an arbitrary pressing load can be applied and the pressing load can be finely adjusted.

As an implementation of the present invention, the first pressing member is adapted to include a thermal head which allows a temperature to be controlled. Accordingly, during testing, any desired heat can be applied to an electronic component that is an object to be tested.

As an implementation of the present invention, the gimbal mechanism has an opening passing through in a direction to be pressed; a tube for supplying and recovering a cooling material or a heating material for cooling or heating the thermal head is inserted through the opening.

Accordingly, compact tubing of the cooling material or the heating material of the thermal head can be realized, and moreover the management of the tubing is facilitated.

As an implementation of the present invention, the gimbal mechanism has two imaginary axes orthogonal to each other in the same plane, and includes a member provided with angular motion in two directions by the two axes. Accordingly, the gimbal mechanism, which can enhance adhesion of a pressing surface of the first pressing member and a surface of the die of the electronic component, can be provided.

As an implementation of the present invention, the gimbal mechanism has: a first member on which a pressing load is applied; a second member attached to the first pressing member; an intermediate member interposed between the first member and the second member; the first member, the intermediate member, and the second member are arranged in a stacked manner in sequence, and are movable in a stacked direction; and the intermediate member has imaginary first and second axes orthogonal to each other in the same plane, and has a degree of freedom with respect to each motion around the axes.

As an implementation of the present invention, the intermediate member has a pair of first concave portions formed on a first surface side facing the first member, and a pair of second concave portions formed on a second surface side facing the second member; the first member has a pair of first convex portions received in the pair of first concave portions on a surface side facing a first surface of the intermediate member; and the second member has a pair of second convex portions received in the pair of second concave portions on a surface side facing a second surface of the intermediate member.

Accordingly, the gimbal mechanism, which can enhance the adhesion of the pressing surface of the first pressing member and the surface of the die of the electronic component, can be realized in a relatively simple configuration.

As an implementation of the present invention, each of the first member, the second member and the intermediate member includes a through hole in its center area, wherein the tube for supplying and recovering a cooling material or a heating material for cooling and heating the thermal head is inserted through each the through hole.

Accordingly, in addition, the compact tubing of a cooling material or a heating material of the thermal head can be realized, and moreover the management of the tubing is facilitated.

An electronic component test apparatus of the present invention is an electronic component test apparatus including an electronic component pressing device for pushing a terminal of an electronic component to be tested against a contact portion of a test head; the electronic component pressing device being composed of an electronic component pressing device according to any of the above invention.

Accordingly, the electronic component test apparatus incorporating advantages of the electronic component pressing device according to the above invention can be realized.

The present invention may have the following advantages.

(1) The pressing load on the die and the substrate of the electronic component can be individually managed, in such case the pressing load on the die of the electronic component can be minutely managed as required, and adhesion of the pressing member to the die of the electronic component can be enhanced.

(2) The large pressing load can be applied on the substrate of the electronic component, while for the pressing load on the die of the electronic component, an arbitrary pressing load can be applied and the pressing load can be finely adjusted.

(3) During testing, any desired heat can be applied to the electronic component that is an object to be tested. Moreover, the compact tubing for cooling the thermal head can be realized, and moreover the management of the tubing is facilitated.

BEST MODE FOR CARRYING OUT THE INVENTION

Hereinafter, embodiments of the present invention are described with reference to the drawings.

Embodiment of Electronic Component Test Apparatus

Figure 1:
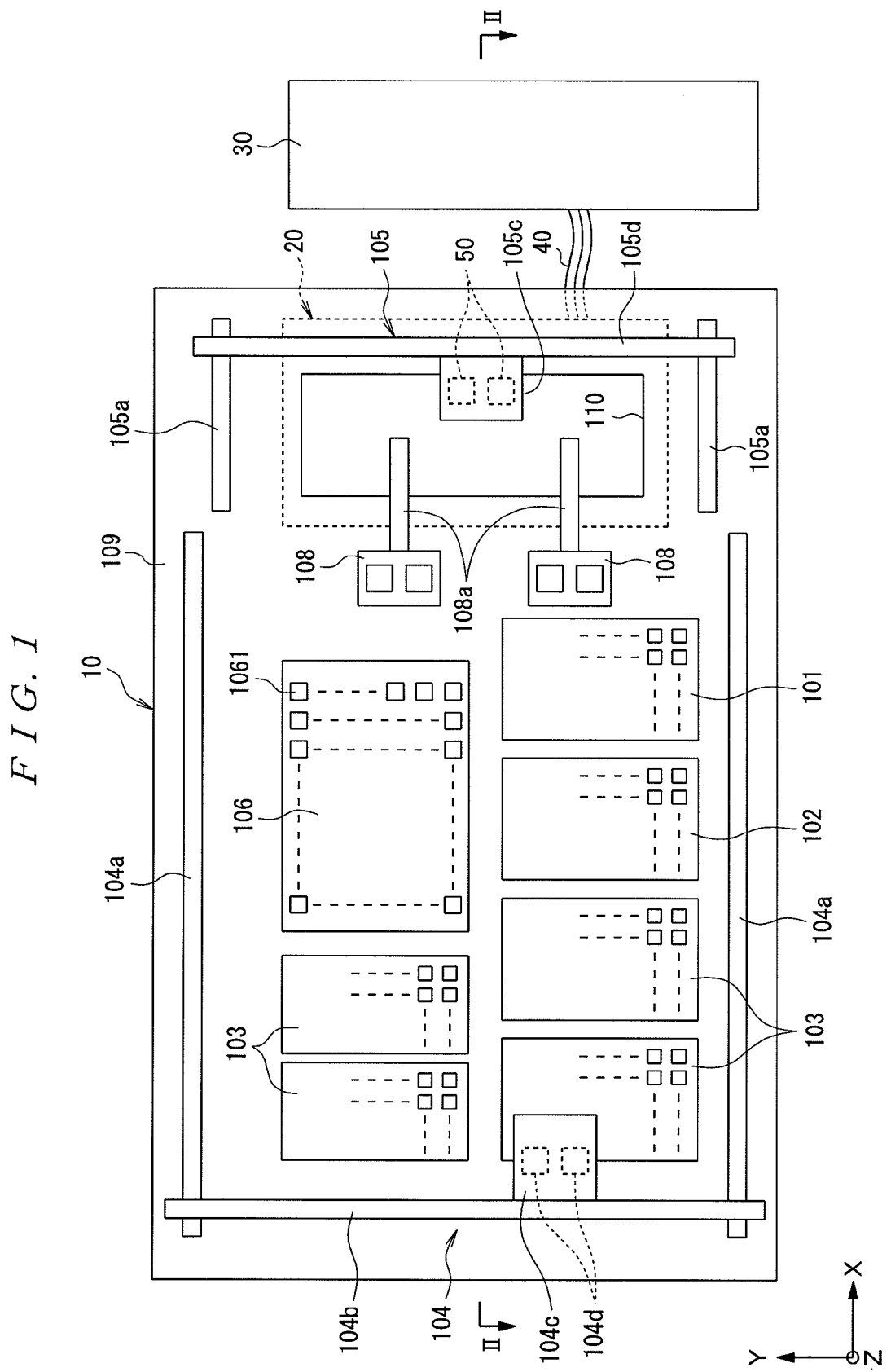
FIG. 1 is a plan view illustrating the configuration of an embodiment of an electronic component test apparatus according to the present invention.
Figure 2:
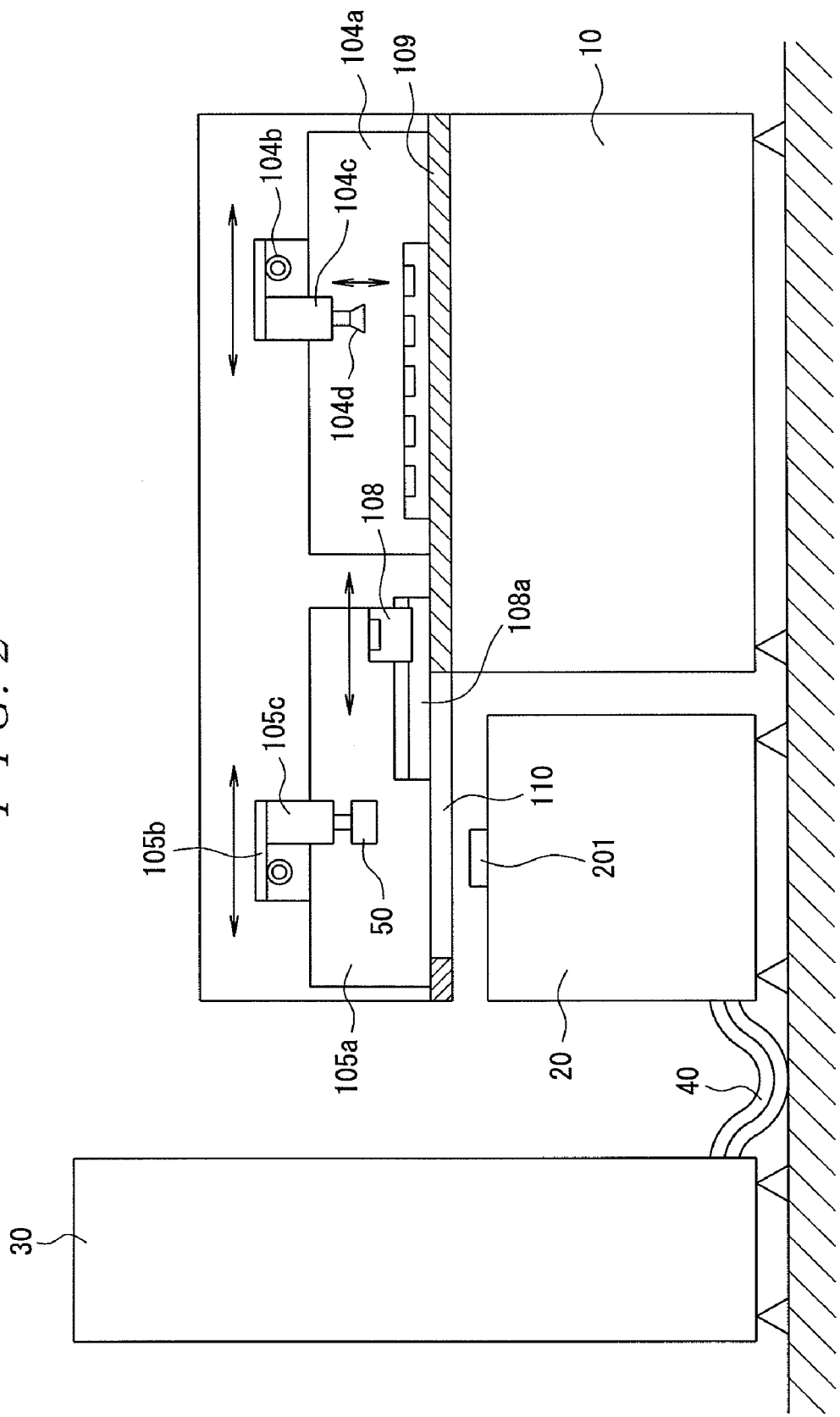
FIG. 2 is a cross-sectional view taken along line II-II of FIG. 1.

FIG. 1 is a plan view illustrating a configuration of an embodiment of an electronic component test apparatus according to the present invention, and FIG. 2 is a cross-sectional view taken along line II-II of FIG. 1.

As shown in FIGS. 1 and 2, the electronic component test apparatus according to the embodiment comprises a handler 10, a test head 20, and a tester 30, in which the test head 20 and the tester 30 are electrically connected through a cable 40.

The electronic component test apparatus is adapted to push a pre-test IC device placed on a supply tray 102 of the handler 10 against a contact portion 201 of the test head 20 by using XY conveyors 104 and 105, carry out a test on the IC device via the test head 20 and the cable 40, and store a tested IC device into a classifying tray 103 in accordance with the test result.

The handler 10 is provided with a substrate 109, and the XY conveyors 104 and 105 for IC devices are provided on the substrate 109. Moreover, an opening 110 is formed in the substrate 109, and as shown in FIG. 2, the IC device is pushed to the contact portion 201 of the test head 20 arranged on the back side of the handler 10 through the opening 110.

Two sets of XY conveyors 104 and 105 are provided on the substrate 109 of the handler 10. Among these the XY conveyor 104 is configured such that an electronic component suction device 104d mounted on a mounting base 104c can move in a region from the classifying tray 103, through the supply tray 102, an empty tray 101, and a heat plate 106, to two buffers 108 and 108 by means of rails 104a and 104b which are provided along an X-axis direction and a Y-axis direction, respectively. Further, a pad of the electronic component suction device 104d can also move in a Z-axis direction, i.e. in the upward/downward directions by means of a Z-axis actuator (not show). Two electronic component suction devices 104d provided on the mounting base 104c, then, can suction, convey and release two IC devices at a time.

On the other hand, the XY conveyor 105 is configured such that an electronic component pressing device 50 mounted on a mounting base 105c can move in a region between the two buffer portions 108 and 108 and the test head 20 by means of rails 105a and 105b which are provided along an X-axis direction and a Y-axis direction, respectively. Further, a tip portion of the electronic component pressing device 50 can also move in a Z-axis direction (the upward/downward directions) by means of a Z-axis actuator (not shown). Two electronic component pressing devices 50 provided on the mounting base 105c can suction, press, convey and release two IC devices at a time.

The two buffer portions 108 and 108 move back and forth between operation regions of two XY conveyors 104 and 105 by means of a rail 108a and an actuator (not shown). In FIG. 1, the buffer portion 108 on the upper side performs an operation of transferring an IC device conveyed from the heat plate 106 to the test head 20. The buffer portion 108 on the lower side performs an operation of ejecting an IC device finished with the test in the test head 20. Due to existence of the two buffer portions 108 and 108, the two XY conveyors 104 and 105 can operate at a time without interfering with each other.

In the operation a region of the XY conveyor 104, arranged are the supply tray 102 with a pre-test IC device placed, the four classifying trays 103 for storing post-test IC devices by classifying to categories in accordance with test results, and the empty tray 101, and the heat plate 106 is further provided at a position close to the buffer portion 108.

The heat plate 106, for example, is a metal plate, the heat plate 106 being formed with a plurality of concave portions 1061 in which IC devices are dropped, wherein a pre-test IC device from the supply tray 102 is transferred to the concave portion 1061 by means of the XY conveyor 104. A heating unit (not shown) for applying a predetermined thermal stress to IC devices is provided in a lower surface of the heat plate 106. After heated to a predetermined temperature by the heat from the heating unit transferred via the heat plate 106, the IC device is pushed against the contact portion 201 of the test head 20 via one buffer portion 108.

Embodiments of Electronic Component Pressing Device

A specific configuration of the electronic component pressing device 50 according to the present invention is now described with reference to FIGS. 3 to 5.

Figure 3:
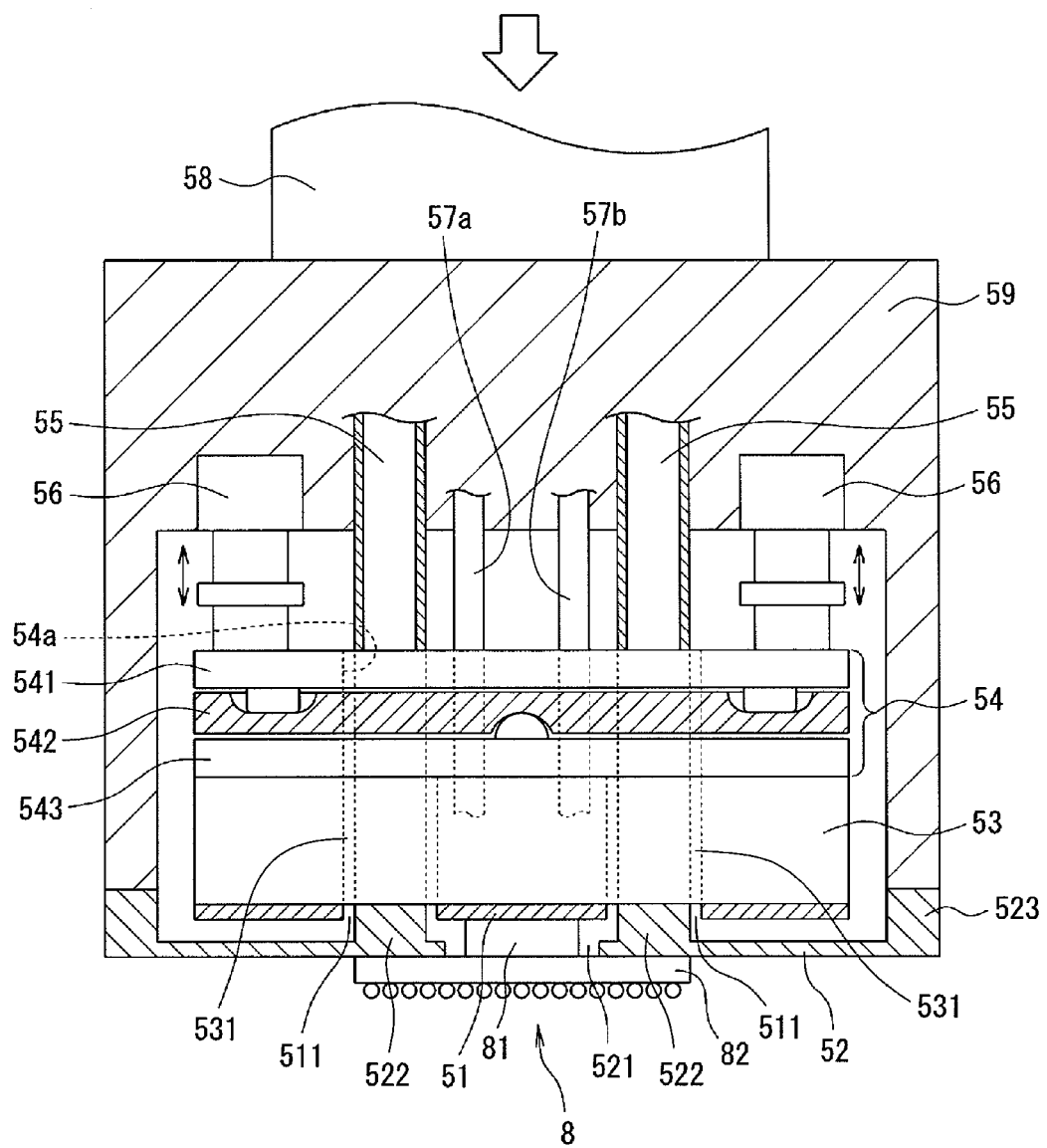
FIG. 3 is a schematic cross-sectional view of the principal part illustrating the configuration of an electronic component pressing device shown in FIG. 1.

FIG. 3 is a schematic cross-sectional view illustrating a specific configuration of the electronic component pressing device 50 shown in FIG. 1. FIG. 4 is an exploded perspective view of the principal part of the electronic component pressing device 50. FIG. 5 is a perspective view of the principal part of the electronic component pressing device 50 in an assembled state.

Figure 4:
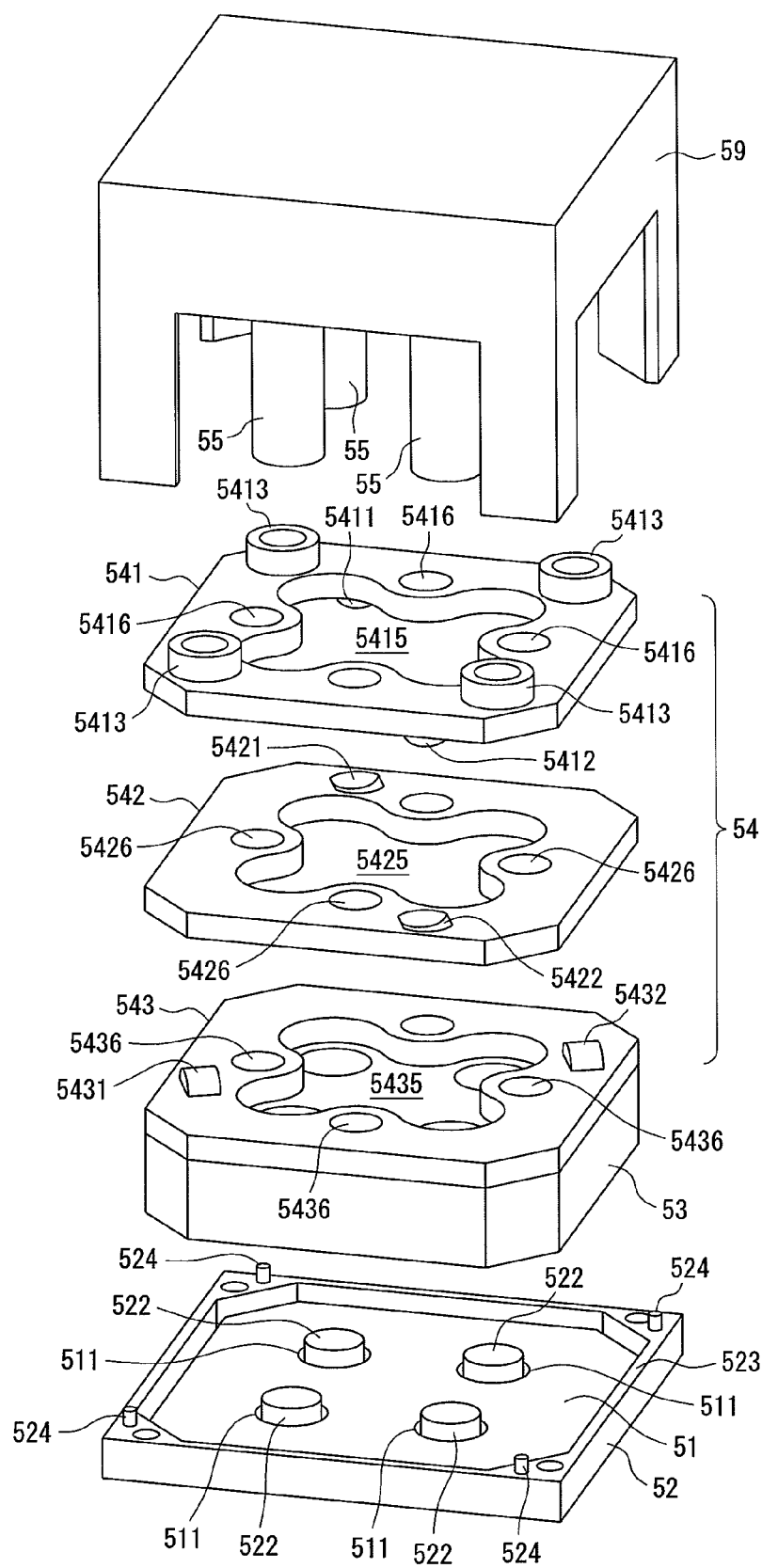
FIG. 4 is an exploded perspective view of the principal part of the electronic component pressing device.

As shown in FIGS. 3 and 4, the electronic component pressing device 50 comprises a first pressing member 51, a second pressing member 52, a thermal head 53, a gimbal mechanism 54, four pipes for suction and pressure 55, four pneumatic cylinders 56, and cooling tubes 57a and 57b, wherein each of these structural elements is held to a frame 59 attached to a rod 58 with suitable means as described later.

The electronic component pressing device 50 is adapted to be able to suction an IC device 8 that is an object to be tested, and push external terminals of the IC device 8 against the contact portion 201 of the test head 20.

The first pressing member 51 is adapted such that a part of its lower surface contacts the entire upper surface of a die 81 of the IC device 8, and presses the entire upper surface of the die 81. The first pressing member 51 has through holes 511 at each of four sites near to the center (see FIG. 4) such that four convex portions 522 of the second pressing member 52 each can be inserted through each of the four through holes 511.

Further, the first pressing member 51 is configured such that its upper surface side is replaceably attached to the lower surface side of the thermal head 53 with four screws and the like. Therefore, in the case of changing the kind and the like of the IC device 8 to be subjected to the test, in response to the change, the first pressing member 51 can be easily replaced by a prepared new first pressing member (not shown).

The second pressing member 52 is adapted such that a part of its lower surface contacts an upper surface of a substrate 82 of the IC device 8, and press the upper surface of the substrate 82. In a center area of the second pressing member 52, an opening 521 is opened, in which a portion of the die 81 of the IC device 8 is positioned within the opening 521 when tested. Also, four convex portions 522 are provided around the opening 521 of the second pressing member 52. Each lower side of the four convex portions 522 presses the upper surface of the substrate 82 of the IC device 8.

Further, the second pressing member 52 is reinforced with the entire peripheral portion 523 thereof protruded (see FIG. 4), and four sites of the reinforced peripheral portion 523 is replaceably attached to a lower end of the frame 59 with screws 524. Therefore, in the case of changing the kind and the like of the IC device 8 to be subjected to the test, in response to the change, the second pressing member 52 can be easily replaced by a prepared new second pressing member (not shown).

The thermal head 53 is a heating source being able to heat the first pressing member 51, and maintains the IC device 8 at a predetermined temperature to prevent the temperature of the IC device 8 heated by the heat plate 106 from decreasing during conveying. The thermal head 53 is adapted such that a heating temperature thereof can be controlled by a controller (not shown).

The thermal head 53 has through holes 531 at four sites in a direction to be pressed, and the four pipes for suction and pressure 55 each pass through each through holes 531. Also, the thermal head 53 is adapted such that a cooling material is supplied and discharged through the cooling tubes 57a and 57b. Therefore, the thermal head 53 can properly perform temperature control by the cooling of the cooling material.

Note that a liquid (liquid coolant) or a gaseous matter (gas) is used as the above cooling material (coolant).

The gimbal mechanism 54 makes the pressing lower surface of the first pressing member 51 adhere to the entire upper surface of the die 81 to effectively perform heat conduction from the thermal head 53 to the die 81 when the first pressing member 51 presses the upper surface of the die 81 of the IC device 8.

Therefore, the gimbal mechanism 54 includes an upper plate 541, a lower plate 543 attached to the thermal head 53, and an intermediate plate 542 interposed between the both plates 541 and 543 (see FIGS. 3 and 4), which are arranged in a stacked manner and adapted to be movable in the upward/downward directions (in a stacked direction) while guided by four guide bars 544. Moreover, the upper plate 541 is adapted such that a pressing load is downwardly applied with the four pneumatic cylinders 56, and the thermal head 53 is attached to the lower plate 543 (see FIGS. 3 and 5).

Figure 6:
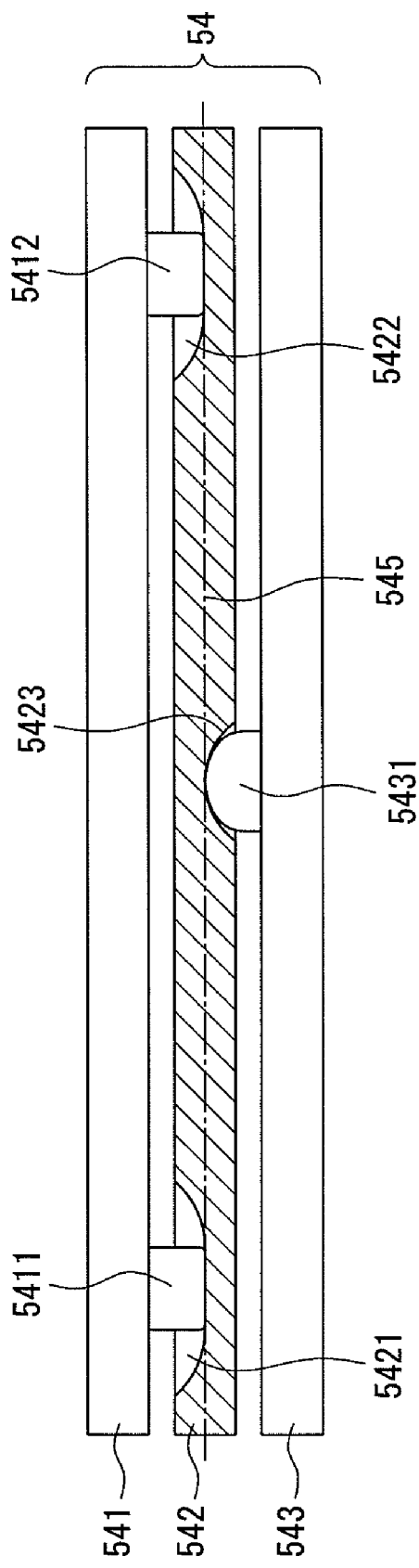
FIG. 6 is a cross-sectional view of the principal part of a gimbal mechanism.
Figure 7:
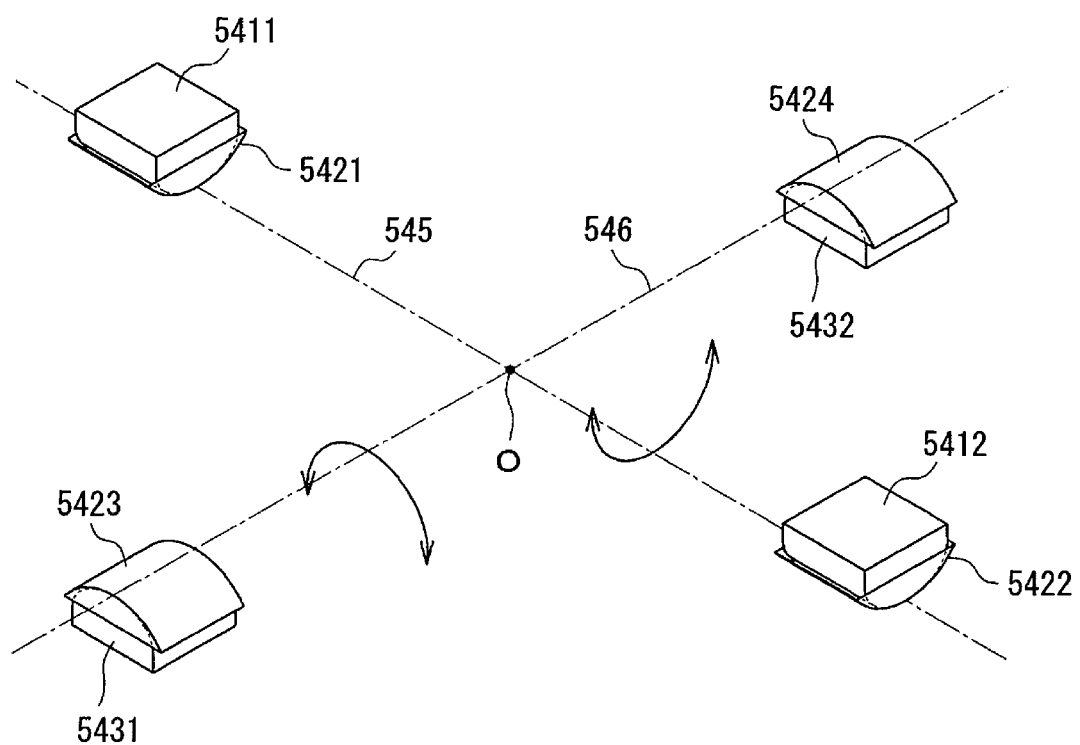
FIG. 7 is an explanatory diagram of conceptually illustrating a configuration of the gimbal mechanism.
Figure 8:
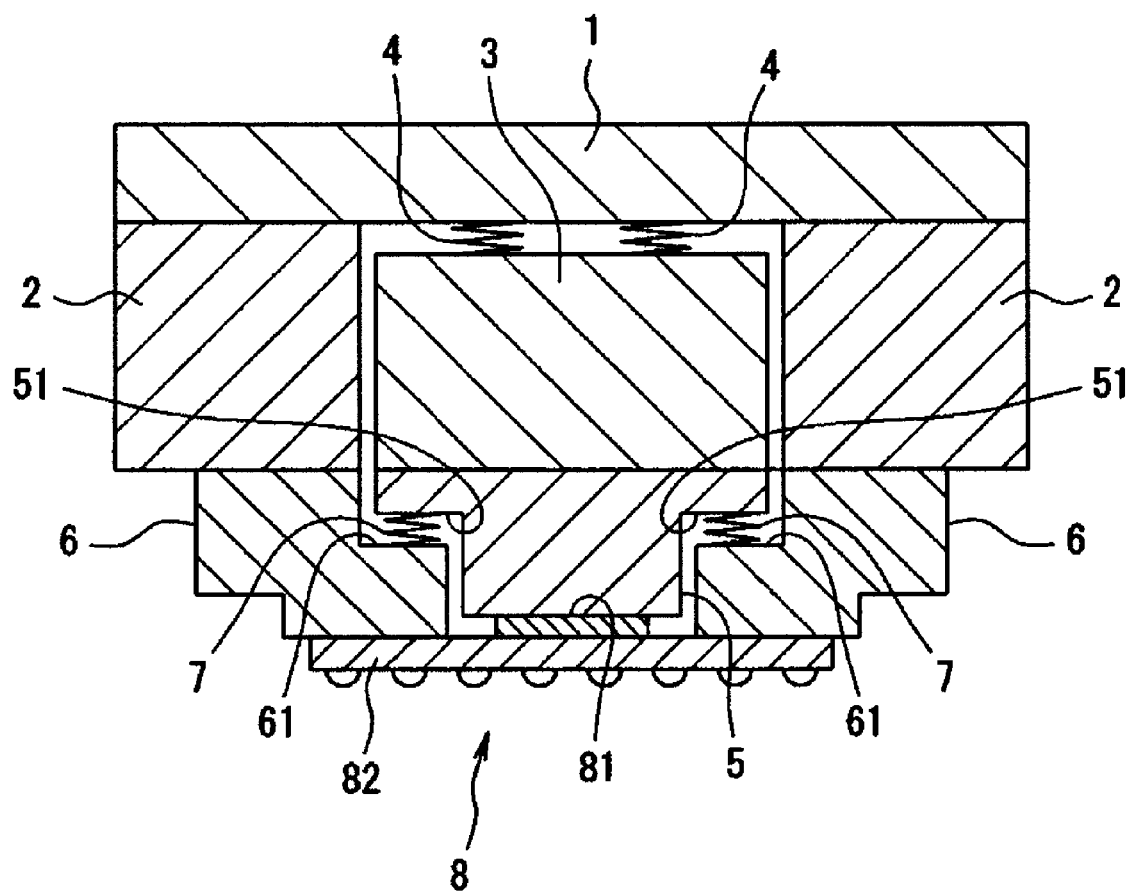
FIG. 8 is a cross-sectional view of a conventional device.

As shown in FIGS. 6 and 7, the gimbal mechanism 54 has two imaginary axes 545 and 546 orthogonal to each other in the same plane, and the intermediate plate 542 is adapted to provide an angular motion in the direction of rotation around each of the two axes 545 and 546. Specifically, the intermediate plate 542 has a degree of freedom with respect to each motion around the axis of the two imaginary axes 545 and 546 orthogonal to each other in the same plane.

Further, the gimbal mechanism 54 has an opening 54a in its center area and passed therethrough in a direction to be pressed, through which the four pipes for suction and pressure 55, and the cooling tubes 57a and 57b are each arranged in a penetration manner (see FIG. 3).

A specific configuration of the gimbal mechanism 54 is now described with reference to FIGS. 4 to 7.

As shown in FIG. 4, the intermediate plate 542 is formed with a pair of concave portions 5421 and 5422 on the upper surface side of the intermediate plate 542 and at two opposed predetermined positions so as to be recessed from its upper surface, respectively. The concave portions 5421 and 5422 are composed of, for example, half-cylinder-shape. Moreover, the intermediate plate 542 is formed with a pair of concave portions 5423 and 5424 on the lower surface side of the intermediate plate 542 and at two opposed predetermined positions so as to be recessed from its lower surface, respectively (see FIGS. 6 and 7).

At a predetermined position on a lower surface side of the upper plate 541, a pair of convex portions 5411 and 5412, which are received in a pair of concave portions 5421 and 5422 described above, are each formed so as to be projected from its lower surface. The convex portions 5411 and 5412 are composed of, for example, half-cylinder-shape. Moreover, at a predetermined position of an upper surface of the upper plate 541, four pressing portions 5413 are provided which are contacted and pressed by each rod of the four pneumatic cylinders 56.

At a predetermined position on a lower surface side of the lower plate 543, a pair of convex portions 5431 and 5432, which are received in a pair of concave portions 5423 and 5424 described above, are each formed so as to be projected from its lower surface. The lower surface of the lower plate 543 is attached to an upper surface of the thermal head 53.

As shown in FIG. 4, the upper plate 541, the intermediate plate 542 and the lower plate 543 are respectively formed with through holes 5415, 5425 and 5435 on the center side thereof, through which the four pipes for suction and pressure 55 as well as cooling tubes 57a and 57b each pass. Notes that the through holes 5415, 5425 and 5435 form the above opening 54a (see FIG. 3).

Also, in close proximity to the through hole 5415, four guide holes 5416 through which the four guide bars 544 are inserted are each formed. Likewise, in close proximities to through holes 5425 and 5435 through which the four guide bars 544 are inserted, four guide holes 5426 and four guide holes 5436 each are formed.

Figure 5:
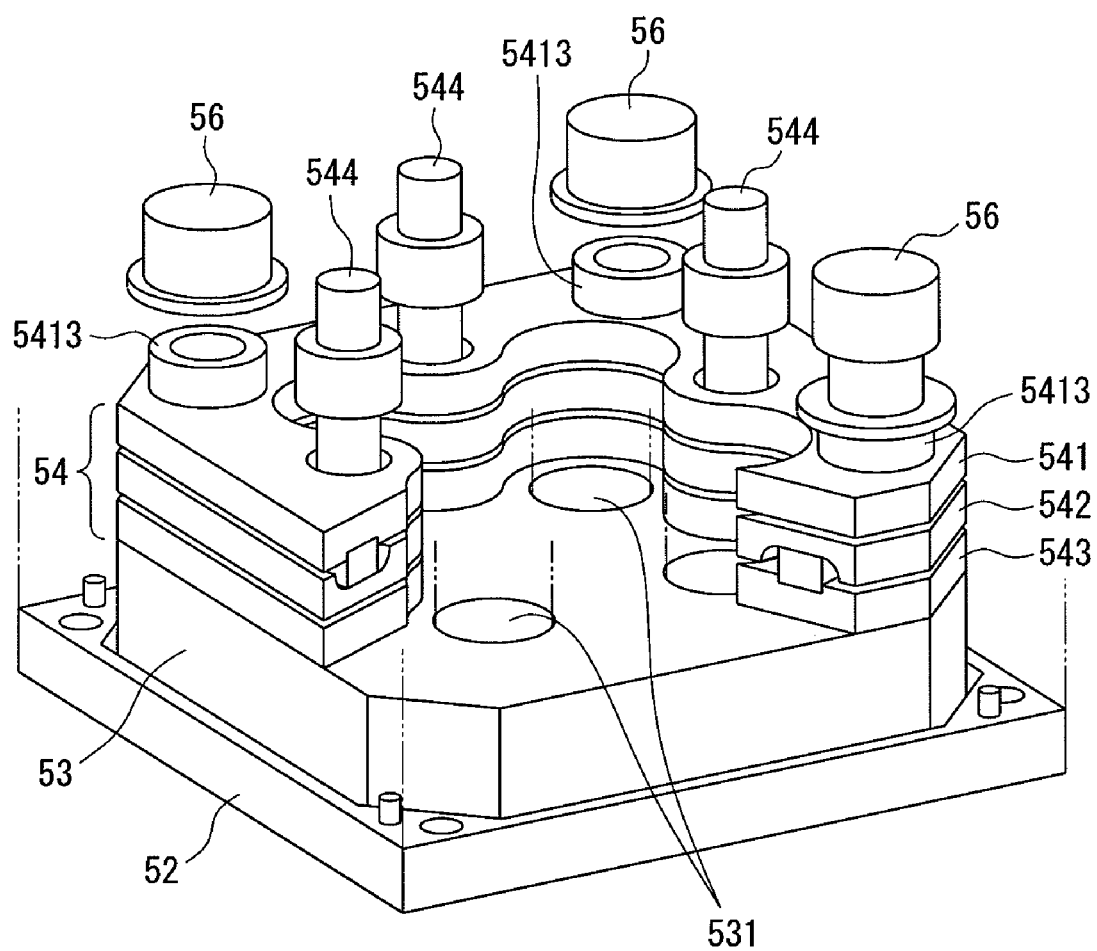
FIG. 5 is a perspective view of the principal part of the electronic component pressing device in an assembled state.

In the upper plate 541, the intermediate plate 542, and the lower plate 543 which are composed of such form, as shown in FIG. 5, one guide bar 544 is inserted through the guide holes 5416, 5426 and 5436, three of which correspond in the upward/downward directions being one set. Thus, as a whole, the four guide bars 544 are inserted therethrough. Therefore, three plates 541 to 543 are movably supported by the four guide bars 544, and adapted to be guided in the upward/downward directions.

Moreover, the four pipes for suction and pressure 55 as well as the cooling tubes 57a and 57b are arranged to pass through the through holes 5415, 5425 and 5435 of the upper plate 541, the intermediate plate 542 and the lower plate 543, respectively.

In the gimbal mechanism 54 composed of such configuration, a pair of concave portions 5421 and 5422 of the intermediate plate 542, as shown in FIG. 7, is configured such that its bottom is located on an imaginary axis 545 and its longitudinal direction is in a direction along the axis 545. On the other hand, a pair of concave portions 5423 and 5424 thereof is configured such that its bottom is located on the imaginary axis 546, and its longitudinal direction is in a direction along the axis 546. Also, as shown in FIG. 7, the convex portions 5411 and 5412 of the upper plate 541 are contained in the concave portions 5421 and 5422 of the intermediate plate 542. Further, as shown in FIG. 7, the convex portions 5431 and 5432 of the under plate 543 are contained in the concave portions 5423 and 5424 of the intermediate plate 542. Moreover, the intermediate plate 542, then, is adapted to form a gap having a predetermined spacing between the upper plate 541 and the lower plate 543 (see FIG. 6).

Therefore, the intermediate plate 542 has the imaginary two axes 545 and 546 orthogonal to each other in the same plane, and has a degree of freedom with respect to each motion around the axes. In other word, the intermediate plate 542 can freely move about the point of intersection O where the axis 545 is orthogonal to the axis 546.

Accordingly, the surface conformance between the lower surface of the first pressing member 51 integrated with the gimbal mechanism 54 and the upper surface of the die 81 of the IC device 8 is ensured. As a result, a precise load against the die 81 of the IC device 8 can be uniformly pressed in the surface of the die 81, and an excellent heat transfer property from the thermal head 53 through the first pressing member 51 to the die 81 of the IC device 8 can ensure temperature control of the die 81.

Each of four pneumatic cylinders 56 is an actuator which acts as pressure applying means for applying a pressing load on the gimbal mechanism 54. The four pneumatic cylinders 56 are each adapted to be attached to the frame 59, and such that the rods thereof each contact four pressing portions 5413 of the upper plate 541 which constitute the gimbal mechanism 54.

Also, four pneumatic cylinders 56 are each adapted such that its pneumatic pressure can be arbitrarily set, or the pneumatic pressure can be finely adjusted. Specifically, the four pneumatic cylinders 56 are adapted such that a pressing load applied to the first pressing member 51 can be arbitrarily set, or finely adjusted through the gimbal mechanism 54.

The four pipes for suction and pressure 55 utilize a load applied downwardly to the frame 59, and act as a part of the pressure applying means for applying a pressing load on the second pressing member 52. Therefore, the four pipes for suction and pressure 55 are adapted such that upper sides thereof are each integrally attached to the frame 59, and the lower end sides thereof each contact the convex portion 522 of the second pressing member 52.

Note that the four pipes for suction and pressure 55 can perform suction, and in such suction, an IC device 8 that is an object to be tested can be suctioned by a means (not shown).

The cooling tubes 57a and 57b are tubes for supplying and recovering a cooling material for cooling the thermal head 53, the cooling tubes 57a and 57b being arranged in a form inserted through the opening 54a of the gimbal mechanism 54, and each one end side is connected to the thermal head 53. For example, the cooling pipe 57a is used for supplying a cooling material to the thermal head 53, and the cooling pipe 57b is used for discharging the cooling material recovered from the thermal head 53.

In this way, the cooling tubes 57a and 57b for cooling the thermal head 53 are arranged in the form inserted through the opening 54a of the gimbal mechanism 54, and therefore compact tubing for cooling the thermal head 53 can be realized, and moreover the management of the tubing is facilitated.

Moreover, the frame 59 is attached to a servomotor (not shown) via the rod 58, the servomotor being able to lower the frame 59 downwardly. The servomotor is adapted such that a downward pressing force can be arbitrarily set, or the pressing force can be finely adjusted. Specifically, the servomotor is an actuator that acts as the pressure applying means for applying a pressing load applied to the second pressing member 52 via the four pipes for suction and pressure 55, and each pressing force can be arbitrarily set, or finely adjusted.

Operation Example of Electronic Component Test Apparatus

As an example of the case of testing IC devices 8 under a high temperature conditions, an operation of the electronic component test apparatus will be now described.

The electronic component suction device 104d of the X-Y conveyor 104 suctions and holds a pre-test IC device 8 placed on the supply tray 102 of the handler 10 to convey the pre-test IC device 8 to the concave portion 1061 of the heat plate 106, and release the IC device 8 over the concave portion 1061. The IC device 8 is left for a predetermined time at the heat plate 106 to be heated to a predetermined temperature. The electronic component suction device 104d of the X-Y conveyor 104 suctions and holds the IC device 8 heated to a predetermined temperature at the heat plate 106, transfers the IC device 8 to the buffer portion 108 located at the left end of the rail 108a in FIG. 1 to release the IC device 8 over the buffer portion 108.

The buffer portion 108 with the IC device 8 placed thereon moves to the right end of the rail 108a. The electronic component pressing device 50 of the X-Y conveyor 105 suctions and holds the IC device 8 that has been moved on the buffer portion 108, and transfers it to the contact portion 201 of the test head 20. Then, the electronic component pressing device 50 of the X-Y conveyor 105 pushes the IC device 8 against the socket of the contact portion 201 through the opening 110 of the substrate 109.

At this time, in the electronic component pressing device 50, the first pressing member 51 presses the die 81 of the IC device 8, and the second pressing member 52 presses the substrate 82 of the IC device 8, so that the die 81 and the substrate 82 of the IC device 8 can be pressed by a different load. Moreover, since a pressing load on the die 81 by the first pressing member 51 is provided by four pneumatic cylinders 56, each pressing load can be arbitrarily set, or the each pressing load can be finely adjusted.

Note that each pressing load which may be arbitrarily set is, for example, from 0 to 400 N.

In addition, the electronic component pressing device 50 includes the gimbal mechanism 54 integrated with the first pressing member 51, and therefore the surface conformance (surface contact) between the lower surface of the first pressing member 51 and the upper surface of the die 81 of the IC device 8 is ensured. As a result, a precise load against the die 81 of the IC device 8 can be uniformly pressed in the surface of the die 81, excellent heat transfer property from the thermal head 53 through the first pressing member 51 to the die 81 of the IC device 8 is provided, and temperature control of the die 81 can be ensured.

When the electronic component pressing device 50 pushes the IC device 8 against the socket of the contact portion 201, and when external terminals of the IC device 8 are connected to probe pins of the socket, a test signal is applied to the IC device 8 from the tester 30 through the test head 20. The response signal read from the IC device 8 is sent to the tester 30 through the test head 20, so that the IC device 8 is tested for its performance, functions and the like.

After the test of the IC device 8 is finished, the electronic component pressing device 50 of the X-Y conveyor 105 transfers a post-test IC device 8 to the buffer portion 108 located at the right end of the rail 108, and the buffer portion 108 moves to the left end in FIG. 1. The electronic component suction device 104d of the X-Y conveyor 104 suctions and holds the post-test IC devices 8 from the buffer portion 108, and stores the post-test IC devices 8 into the classifying tray 103 in accordance with the test result.

Modification

Although the above first pressing member 51 is configured to include the thermal head 53, depending on the type of the IC device 8 that is an object to be tested, its characteristic test, and the like, the above first pressing member 51 does not have to be used integrally with the thermal head 53. In the case where the thermal head 53 is not necessary, the first pressing member 51 may be configured as the first pressing member 51 up to a part corresponding to the thermal head 53. Note that in the case where the thermal head 53 is not included, the cooling tubes 57a and 57b are not used.

Also, in the above embodiment, although the pneumatic cylinder 56 is used as an actuator which acts as a pressing load applying means for applying a pressing load to the gimbal mechanism 54, alternatively, an electric or hydraulic actuator may be used.

In addition, in the above embodiment, although a servomotor is used as the actuator which acts as the pressing load applying means for applying a pressing load to the second pressing member 52, alternatively, a pneumatic or hydraulic actuator may be also used.

Also, in the above embodiment, a cooling material such as a liquid coolant is used for the cooling pipes 57a and 57b to cool the thermal head 53. However, the thermal head 53 may need to be not only cooled, but also heated. In this case, as a material supplied to and recovered from the cooling pipes 57a and 57b, a heating material for heating the thermal head 53 is used. Therefore, a cooling and a heating materials may be selectively used for the cooling pipes 57a and 57b as required, and in this regard, the cooling and the heating materials act as a temperature adjusting material for adjusting (increasing or decreasing) the temperature of the thermal head.

INDUSTRIAL APPLICABILITY

According to the present invention, the pressing load on the die and the substrate of the electronic component can be individually managed, in such case the pressing load on the die of the electronic component can be minutely managed as required, and adhesion of the pressing member to the die of the electronic component can be enhanced.

Moreover, according to the present invention, the large pressing load can be applied on the substrate of the electronic component, while for the pressing load on the die of the electronic component, an arbitrary pressing load can be applied and the pressing load can be finely adjusted.

Further, according to the present invention, during testing, any desired heat can be applied to the electronic component that is an object to be tested. Moreover, the compact tubing for cooling the thermal head can be realized, and moreover the management of the tubing is facilitated.

The invention claimed is:

1. An electronic component pressing device for pushing a terminal of an electronic component to be tested against a contact portion of a test head, the electronic component pressing device comprising:
    a first pressing member for pressing a predetermined first region of the electronic component to be tested;
    a second pressing member for pressing a predetermined second region other than the first region of the electronic component to be tested;
    a gimbal mechanism for adhering the first pressing member to the first region when the first pressing member presses the first region of the electronic component to be tested;
    a thermal head arranged on a lower surface side of the gimbal mechanism, and heating the first pressing member;
    first pressing load applying means for applying a first pressing load on the gimbal mechanism to adjust the first pressing load applied on the first pressing member via the gimbal mechanism; and
    second pressing load applying means for applying a second pressing load on the second pressing member,
    wherein the first pressing load applying means is configured with a pneumatic cylinder, and the second pressing load applying means is configured with an actuator, and
    wherein the first pressing load applied on the first pressing member and the second pressing load applied on the second pressing member are separately adjusted.

2. The electronic component pressing device according to claim 1,
    wherein the first pressing member is configured to press a center area of the electronic component to be tested; the second pressing member is configured to press a predetermined part other than the center area of the electronic component to be tested.

3. The electronic component pressing device according to claim 2,
    wherein the gimbal mechanism has: a first member on which a pressing load is applied; a second member attached to the first pressing member; and an intermediate member interposed between the first member and the second member; and wherein the first member, the intermediate member, and the second member are arranged in a stacked manner in sequence, and are movable in a stacked direction; and the intermediate member has imaginary first and second axes orthogonal to each other in the same plane, and has a degree of freedom with respect to each motion around the axes.

4. The electronic component pressing device according to claim 1,
    wherein the gimbal mechanism has an opening passing through in a direction to be pressed; and a tube for supplying and recovering a cooling material or a heating material for cooling or heating the thermal head is inserted through the opening.

5. The electronic component pressing device according to claim 1, wherein the gimbal mechanism has two imaginary axes orthogonal to each other in the same plane, and includes a member provided with angular motion in two directions by the two axes.

6. An electronic component test apparatus, comprising: an electronic component pressing device for pushing a terminal of an electronic component to be tested against a contact portion of a test head; wherein the electronic component pressing device is composed of an electronic component pressing device according to claim 1.

7. An electronic component pressing device, for pushing a terminal of an electronic component to be tested against a contact portion of a test head, the electronic component pressing device comprising:
    a first pressing member for pressing a predetermined first region of the electronic component to be tested;
    a second pressing member for pressing a predetermined second region other than the first region of the electronic component to be tested;
    a gimbal mechanism for adhering the first pressing member to the first region when the first pressing member presses the first region of the electronic component to be tested;

first pressing load applying means for applying a pressing load on the gimbal mechanism; and second pressing load applying means for applying a pressing load on the second pressing member;

wherein the gimbal mechanism has a first member on which a pressing load is applied; a second member attached to the first pressing member; and an intermediate member interposed between the first member and the second member;

wherein the first member, the intermediate member, and the second member are arranged in a stacked manner in sequence, and are movable in a stacked direction; and the intermediate member has imaginary first and second axes orthogonal to each other in the same plane, and has a degree of freedom with respect to each motion around the axes; and wherein the intermediate member has a pair of first concave portions formed on a first surface side facing the first member, and a pair of second concave portions formed on a second surface side facing the second member; the first member has a pair of first convex portions received in the pair of first concave portions on a surface side facing a first surface of the intermediate member; and the second member has a pair of second convex portions received in the pair of second concave portions on a surface side facing a second surface of the intermediate member.

8. The electronic component pressing device according to claim 7, wherein each of the first member, the second member and the intermediate member includes a through hole in its center area, and in that the tube for supplying and recovering a cooling material or a heating material for cooling and heating the thermal head is inserted through each of the through holes.

9. An electronic component test apparatus, comprising: an electronic component pressing device for pushing a terminal of an electronic component to be tested against a contact portion of a test head; wherein the electronic component pressing device is composed of an electronic component pressing device according to claim 7.

* * * * *